(12) United States Patent
Cao et al.

(10) Patent No.: US 9,966,483 B2
(45) Date of Patent: May 8, 2018

(54) SEMICONDUCTOR NANOWIRE ANTENNA SOLAR CELLS AND DETECTORS

(71) Applicant: The Board of Trustees of the Leland Stanford Junior University, Palo Alto, CA (US)

(72) Inventors: Linyou Cao, Cary, NC (US); Pengyu Fan, Stanford, CA (US); Alok Vasudev, Stanford, CA (US); Jon A. Schuller, San Diego, CA (US); Mark L. Brongersma, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days. days.

(21) Appl. No.: 14/717,768

(22) Filed: May 20, 2015

(65) Prior Publication Data

US 2015/0364617 A1    Dec. 17, 2015

Related U.S. Application Data

(62) Division of application No. 13/065,050, filed on Mar. 11, 2011, now abandoned.

(60) Provisional application No. 61/340,125, filed on Mar. 12, 2010.

(51) Int. Cl.
| | |
|---|---|
| *H01L 31/044* | (2014.01) |
| *H01L 31/0232* | (2014.01) |
| *B82Y 20/00* | (2011.01) |
| *H01L 31/0352* | (2006.01) |
| *H01L 31/054* | (2014.01) |
| *B01J 19/12* | (2006.01) |
| *H01L 31/068* | (2012.01) |

(52) U.S. Cl.
CPC ...... *H01L 31/02327* (2013.01); *B01J 19/127* (2013.01); *B82Y 20/00* (2013.01); *H01L 31/035227* (2013.01); *H01L 31/0543* (2014.12); *H01L 31/068* (2013.01); *Y02E 10/52* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| | | | |
|---|---|---|---|
| 2010/0012180 A1* | 1/2010 | Day ...................... | B81C 99/008 136/256 |
| 2011/0041900 A1* | 2/2011 | Park ................ | H01L 31/035281 136/255 |

OTHER PUBLICATIONS

Cao, L., Fan, P., Vasukev, A., White, J., Yu, Z., Cai, W., Schuller, J., Fan, S., Brongersma, M., Semiconductor Nanowire Optical Antenna, 2010, Nano Letters, 10, 439-445.*

* cited by examiner

*Primary Examiner* — Bach T Dinh
(74) *Attorney, Agent, or Firm* — Lumen Patent Firm

(57) ABSTRACT

Patterning planar photo-absorbing materials into arrays of nanowires is demonstrated as a method for increasing the total photon absorption in a given thickness of absorbing material. Such a method can provide faster, cheaper, and more efficient photo-detectors and solar cells. A thin nanowire can absorb many more photons than expected from the size of the nanowire. The reason for this effect is that such nanowires support cylindrical particle resonances which can collect photons from an area larger than the physical cross-section of the wire. These resonances are sometimes referred to as Mie resonances or Leaky Mode (Continued)

Resonances (LMRs). The nanowires can have various cross section shapes, such as square, circle, rectangle, triangle, etc.

5 Claims, 9 Drawing Sheets

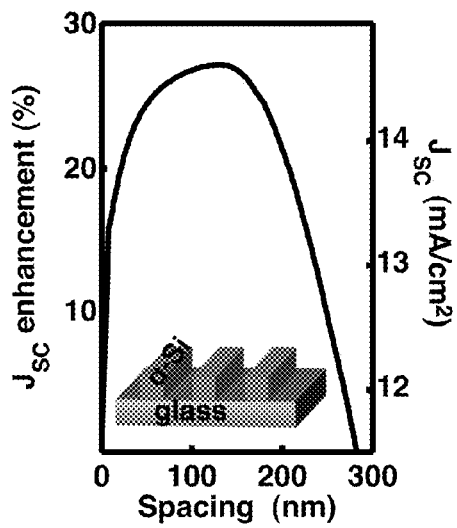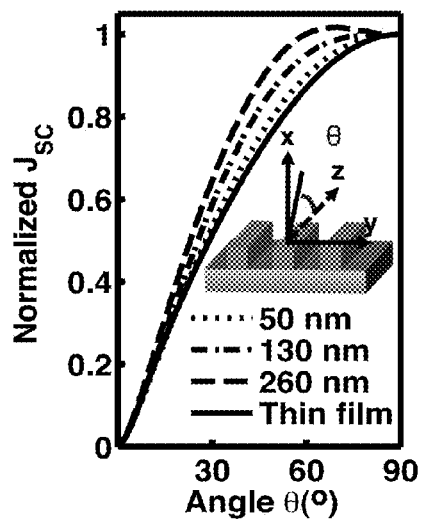
Fig. 8a   Fig. 8b
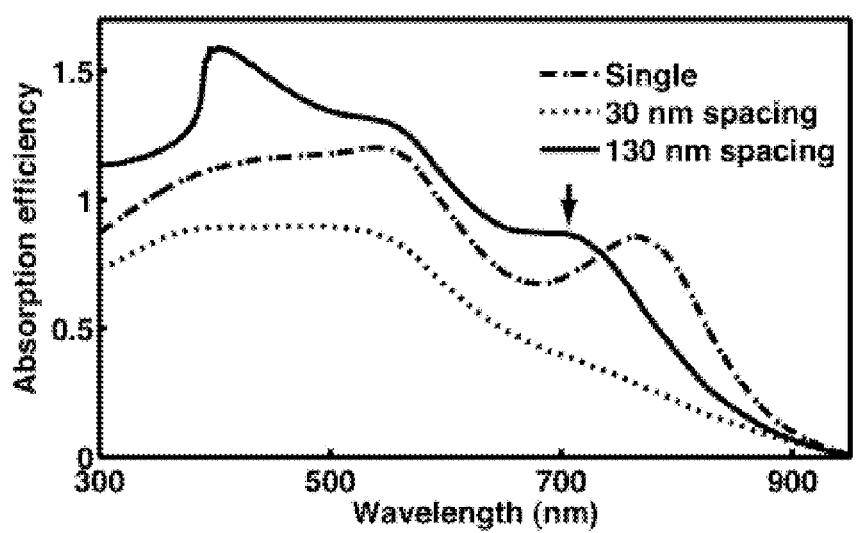
Fig. 8c

SEMICONDUCTOR NANOWIRE ANTENNA SOLAR CELLS AND DETECTORS

CROSS REFERENCE TO RELATED APPLICATIONS

This application is a divisional of U.S. Ser. No. 13/065,050, filed Mar. 11, 2011, and hereby incorporated by reference in its entirety. Application U.S. Ser. No. 13/065,050 claims the benefit of U.S. provisional patent application 61/340,125, filed on Mar. 12, 2010, entitled "Semiconductor Nano-wire Antenna Solar Cells and Detectors", and hereby incorporated by reference in its entirety.

GOVERNMENT SPONSORSHIP

This invention was made with Government support under contract number FA9550-06-1-0470 awarded by the Air Force Aerospace Research OSR. The Government has certain rights in this invention.

FIELD OF THE INVENTION

This invention relates to optical absorption devices for detector and energy applications.

BACKGROUND

Photo-absorbing materials form the basis for optoelectronics applications, such as photo-detectors or solar cells, where photons are absorbed and converted into electrical signals. Typically, the photo-absorbing material is laid down in a planar geometry. Many materials do not absorb photons efficiently and thick layers (100s of nanometers to 100s of microns) are required to absorb the majority of the incident photons.

The large-scale implementation of photovoltaic (PV) technology around the world would greatly benefit from further cost reductions in the manufacturing of solar modules. Moreover, it is important to identify new ways to reduce the amount of semiconductor material used in PV cells, particularly for those cells employing non-earth-abundant elements like indium (CuInGaSe or CIGS cells) or tellurium (CdTe cells). Whereas thin film PV cells offer a viable pathway to reduce fabrication costs and material usage, their energy conversion efficiencies can still be improved significantly by enabling them to harness a larger fraction of the incident solar photons. As a result, researchers are diligently searching for new approaches to dramatically boost the amount of light absorption per unit volume of semiconductor.

In addition to conventional anti-reflection coatings, reflective substrates, and textured surfaces, more advanced light trapping techniques based on resonant cavities, plasmonics, and photonic crystals have recently gained significant interest. The best imaginable photon management (PM) technology would effectively trap and/or concentrate light in a broadband, angle-independent, and polarization-independent fashion. Resonant PM structures have demonstrated significant promise, but their performance is typically limited by a fundamental trade-off between the attainable absorption enhancement and their operational bandwidth. Moreover, resonant structures tend to exhibit a strongly angle-dependent optical response and the resulting solar cells require bulky solar tracking systems to follow the sun's movement in order to maximize their daily energy output. The fabrication of more advanced PM structures that could mitigate some of these issues is typically expensive and the increased cost offsets the potential performance gains.

Nano-wires (or nano-rods) have been employed in connection with solar cells in the art. Typically, the nano-wires are disposed vertically on a substrate (i.e., a "bed of nails" geometry). Representative examples include US 2006/0207647, US 2007/0111368 and US 2008/0047604. Lateral illumination of nano-wires has also been considered, e.g., as in US 2009/0188552.

SUMMARY

In this work, patterning planar photo-absorbing materials into arrays of rods is demonstrated as a method for increasing the total photon absorption in a given thickness of absorbing material. Such a method can provide faster, cheaper, and more efficient photo-detectors and solar cells. In this description, the terms nano-rod, nano-beam, and nano-wire (and also "wire", "beam", and "rod") are regarded as synonyms of each other.

This work has shown that a thin nanowire can absorb many more photons than expected from the size of the nanowire. The reason for this effect is that such nanowires support cylindrical particle resonances which can collect photons from an area larger than the physical cross-section of the wire. These resonances are sometimes referred to as Mie resonances or Leaky Mode Resonances (LMRs). A schematic of such a device is shown in FIGS. 1a-c. Here nano-wire 102 is separated from a substrate 110 with an insulator 108. Terminals 104 and 106 provide electrical contact to nano-wire 102. FIG. 1c is a top view, and FIGS. 1a-b are two orthogonal side views. The measured absorption efficiencies agree well with analytical models based on cylindrical particles (FIG. 1d) and suggest that such rods could be excellent building blocks for photo-absorbing applications such as photo-detectors and solar cells. An important feature of the geometry of FIGS. 1a-c is that the nano-wire is disposed laterally on the substrate.

For practical applications, it is desirable to scale up the single-particle concept to an array which covers a large area, can easily be fabricated, and takes advantage of the small radius of the rods. Via known etch step and/or thin-film deposition techniques, a planar film 202 (FIG. 2a) can be processed to provide an array 204 of rectangular (w≠t) or square (w=t) rods (FIG. 2b), which can cover a large area. Alternatively, rather than covering the entire light collection area with active material, an array of polymer micro-lenses 208 can focus light 210 down onto a sparse array 206 of photo-absorbing rods (FIG. 2c). A single square rod supports quasi-cylindrical modes which are very similar to that of a rod with circular cross-section and similar enhancements in the absorption can be observed for this geometry (FIG. 2d). Here, the curves labeled C-TM and S-TM are for transverse magnetic (TM) polarization and circular and square rod cross sections, respectively. Similarly, the curves labeled C-TE and S-TE are for transverse electric (TE) polarization and circular and square rod cross sections, respectively. The photonic modes in the original film correspond to light interacting with planar structures. After modification, the relevant photonic modes correspond to light interacting with quasi-cylindrical structures. Any solar-cell or photo-detector device layout can be readily modified to work in this new geometry. We show a simple example in FIGS. 3a-b. Here active material 304 is patterned into nano-rods which are vertically sandwiched between electrodes 302 and 306. FIG. 3b is a top view, and FIG. 3a is a side view along line 310 of FIG. 3b. A significant feature of the example of FIGS.

3a-b is that current flows across the width (~10s to 100s of nms) of the nano-rods, in contrast to the situation in FIGS. 1a-c, where current flows along the length (~1.5 micron) of the nano-rod. The implications of this are further described below. The array of FIGS. 3a-b has nano-wires disposed laterally on the substrate.

Our simulations show that the rod array films can have more photon absorption than an unstructured film of the same thickness. The implication of this technique is that we can use thinner photo-absorbing regions to accomplish the same amount of photon absorption. This can result in a number of important technical advantages. First, high-speed photodetectors can be made to operate faster, as less time is required for the generated carriers to transit the device (because they must travel a smaller distance). Second, solar cells and photodetectors can be made more efficient as carriers are less likely to encounter traps and defects as they traverse a shorter distance. This fact could be especially useful for devices made of amorphous Silicon, Germanium, and other semiconductors, which typically have poor electrical transport characteristics. Third, the modified device uses less photo-absorbing material and thus can potentially be made cheaper and in a shorter time.

Significant aspects of the present approach include:
a) The use of enhanced absorption effects in quasi-cylindrical structures; and
b) Further refinements, such as
   i) Using rods of rectangular or square, rather than circular, cross-section;
   ii) A simple technique for fabricating an array of rods with rectangular/square cross-section;
   ii) Such rod arrays can cover a large area and have increased absorption for a given thickness film of photo-absorbing material; and
   iii) The use of electrical transport along the small dimension of the rods (height rather than length) for improved device performance.

A preferred embodiment focuses on the specific case of square rod and rectangular arrays, as we believe that geometry is the most technologically relevant and easy to implement. However, a number of modifications are possible. We have performed simulations showing that rods of differing cross-sections (circular, square, triangular) all support quasi-cylindrical rod modes, and we suspect that rods of rectangular cross-section still exhibit such resonant modes. Although we believe that top-down fabrication of square rods is the most readily accessible route for realizing a useful device, bottom-up growth of arrays of nanowires is another potential method. Our investigations have focused on the technologically important materials Si and Ge, which have relatively large refractive indexes (n~4). The proposed device may be particularly useful for the amorphous forms of those materials. However, the quasi-cylindrical modes exist in materials of any refractive index and thus the technique is broadly applicable, although the efficacy likely depends on the specific material in question. Finally, we note that the technique can be applied to films of varying thicknesses by optimizing the relevant array parameters. We believe that this approach could be used in a large number of photo-detector and solar cell applications to improve device performance. Generally, quasi-cylindrical resonance can be exploited to provide enhanced photo-absorption.

BRIEF DESCRIPTION OF THE DRAWINGS

FIG. 8a is a plot of calculated photocurrent and photocurrent enhancement as a function of nano-wire separation.

FIG. 8b is a plot of normalized photocurrent vs. incident angle for several different nano-wire diameters.

FIG. 8c is a plot of absorption efficiency vs. wavelength for several different nano-wire spacings and potentially non-periodic spacing between the nanowires.

DETAILED DESCRIPTION

Figure 1A:
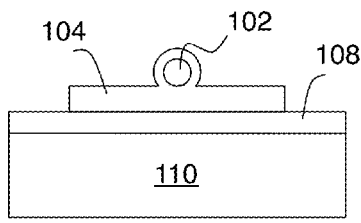
FIGS. 1a-c schematically show an exemplary embodiment of the invention.
Figure 1B:
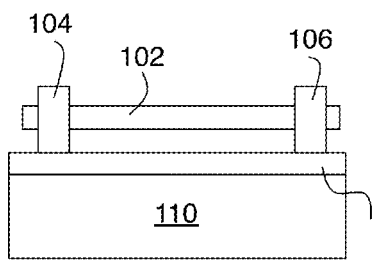
Figure 1C:
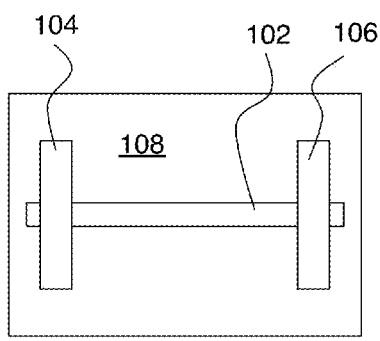
Figure 1D:
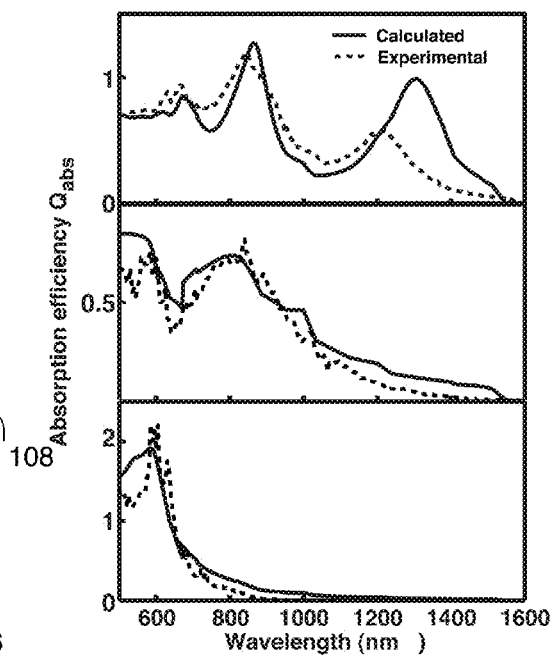
FIG. 1d is a plot of calculated and experimentally measured absorption efficiency.
Figure 2A:
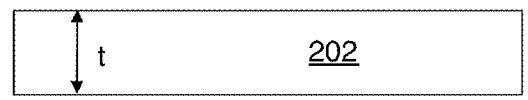
FIGS. 2a-c schematically show another exemplary embodiment of the invention.
Figure 2B:
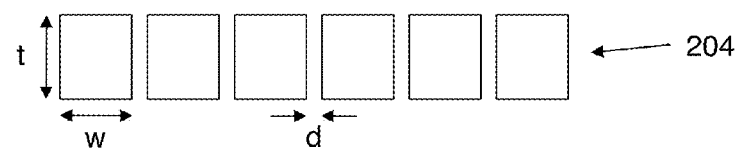
Figure 2C:
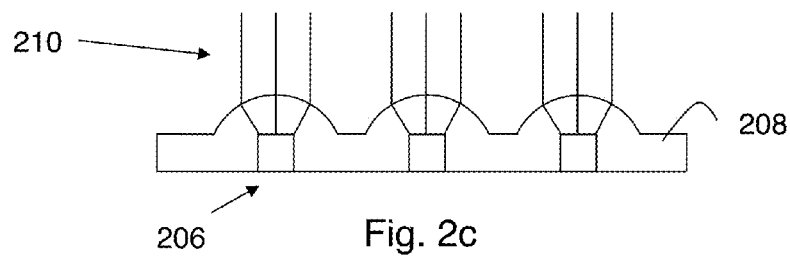
Figure 2D:
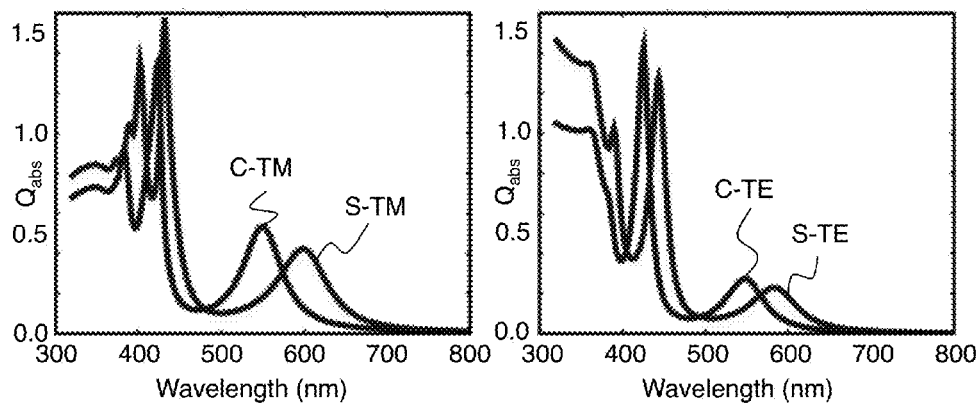
FIG. 2d is a plot of absorption spectra for circular and square rod cross sections.
Figure 3A:
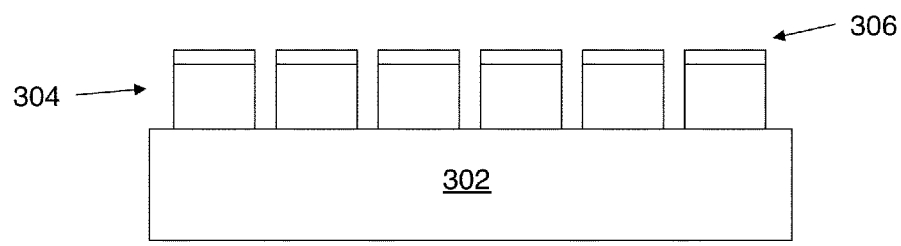
FIGS. 3a-b schematically show a further exemplary embodiment of the invention.
Figure 3B:
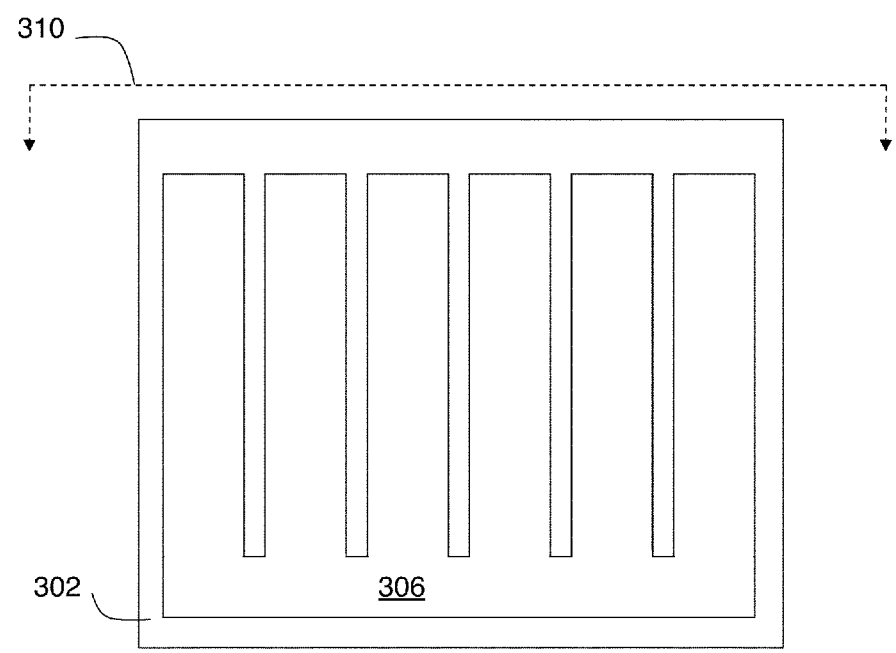

Photovoltaic (PV) cells can serve as a virtually unlimited clean source of energy by converting sunlight into electrical power. Their importance is reflected in the tireless efforts that have been devoted to improving the electrical and structural properties of PV materials. More recently, photon management (PM) has emerged as a powerful additional means to boost energy conversion efficiencies. Here, we demonstrate an entirely new PM strategy that capitalizes on strong broadband optical antenna effects in one-dimensional semiconductor nanostructures to dramatically enhance absorption of sunlight. We show that by patterning the semiconductor layer in a thin film PV cell into an array of nanowires (NWs), one can boost the short-circuit current by 25% while utilizing less than half of the semiconductor material (250% increase in current per unit volume material). The NW's optical properties also naturally give rise to an improved angular response. The approach is universal to any semiconductor and provides a new PV platform technology.

The use of optical antenna effects in 1-dimensional semiconductor nanostructures enables significant enhancement in the absorption of sunlight with little dependence on illumination angle. As sufficiently large diameter (about 100 nm or more) nanowires are known to also exhibit a polarization-independent response, they could serve as an almost ideal building block for PV systems. Building on this notion, we investigate a new type of high-performance PM strategy for solar cells in which a thin semiconductor film is patterned into an array of thoughtfully engineered one-dimensional nanostructures. The most important benefits of this new PM strategy are the ease of fabrication and the broadband nature of the absorption enhancements which is derived from the plurality of optical resonances in the wires that cover the solar spectrum.

Arrays of semiconductor nanostructures with elongated shapes, such as NWs, nanorods, and nanopillars, have recently demonstrated significant promise for photovoltaic applications; these structures can exhibit both enhanced absorption and a reduced reflectivity as compared to planar, film-based devices. In this work, we demonstrate that semiconductor NWs can effectively serve as a set of broadband optical antennas for sunlight. As such, the NWs capture and absorb significantly more solar photons than an equivalent volume of bulk material. We have demonstrated powerful antenna effects in photocurrent measurements on Ge NWs at specific wavelengths. When the illumination wavelength matched one of the allowed leaky mode resonances (LMRs), the high refractive index wire was able to capture and trap the light by multiple internal reflections from its boundary. As a consequence, light absorption and the resulting photocurrent could be enhanced at a desired wavelength by tuning the NW diameter. Here, we illustrate how light absorption in NWs can be increased over the tremendously broadband solar spectrum by taking advantage of the plurality of spectrally-separated LMR resonances supported by relative large (>100 nm) diameter structures. The nature of the antenna effects in NWs also naturally provides for a desirable weak angle- and polarization-dependence of the optical response.

In the following, we start with an experimental demonstration of optical antenna effects in individual Si NWs, which form the basic building blocks of our proposed PV cells. We then continue with an optimization of their absorption efficiencies by engineering the best possible match between the absorption spectrum of the wires and the solar spectrum. In this exercise we not only show large absorption enhancements compared to planar structures, but we also experimentally demonstrate the broad angular response. We continue by showing how this approach can be applied to a great diversity of materials systems (including e.g. amorphous Si, CdTe, GaAs, CuInGeSe, and copper-zinc-tin-sulfur (CZTS) compositions) and wire geometries of different cross-sectional shape (e.g. circular, rectangular, hexagonal or triangular). We conclude by illustrating how the individual NW optimizations can be used to guide the design of large-area devices consisting of a plurality of NWs.

In order to demonstrate the superior optical properties of one-dimensional semiconductor nanostructures over films, we fabricated a set of metal-semiconductor-metal (MSM) photodetectors with individual crystalline SiNWs (c-SiNWs). The c-SiNWs were grown by a gold-catalyzed chemical vapor deposition procedure and spectral absorption properties of the NWs were derived from photocurrent measurements. The measured photocurrent spectra for several c-SiNWs of different diameter are given in FIG. 4a.

Figure 4A:
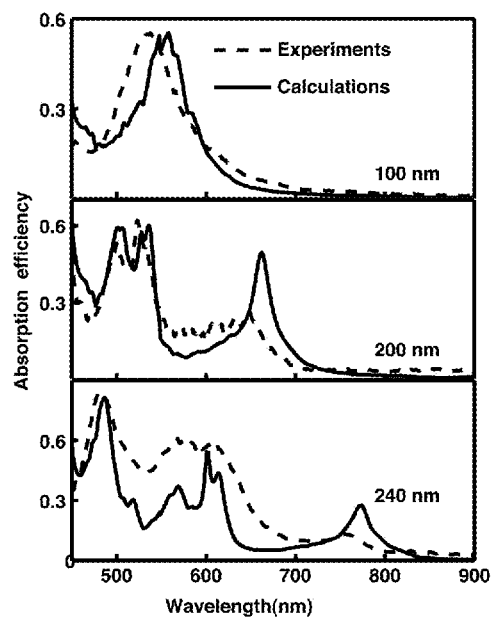
FIG. 4a is a plot of calculated and experimentally measured absorption efficiency.
Figure 4B:
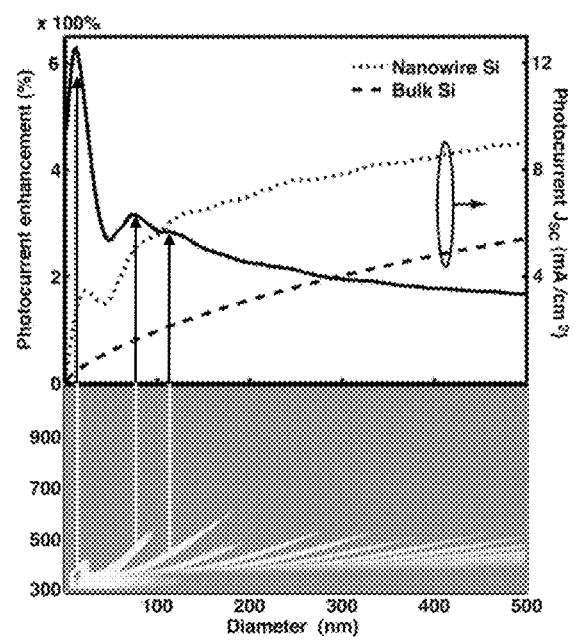
FIG. 4b is a plot of photocurrent and photocurrent enhancement as a function of nano-wire diameter.

FIGS. 4a-b show leaky mode resonances (LMRs) and enhanced photocurrent density in silicon nanowires. FIG. 4a shows measured (dashed) and calculated (solid) spectral absorption efficiency $Q_{abs}$ of single Si nanowires with diameter of 100 nm, 200 nm, and 240 nm. The measured results were scaled by a constant factor over the entire spectrum to best fit the calculations. FIG. 4b (upper part) shows calculated short-circuit photocurrent density $J_{sc}$ for silicon nanowires (dotted line) and for bulk silicon (dashed line) of comparable thickness. The solid line indicates the photocurrent enhancement of the nanowire per unit volume of material; the expression used to calculate the enhancement is $(J_{SC,NW}/V_{NW} - J_{SC,Bulk}/V_{Bulk})/(J_{SC,Bulk}/V_{Bulk})$. FIG. 4b (lower part) Two-dimensional plot of the calculated absorption efficiency $Q_{abs}$ of a crystalline silicon nanowire as functions of the wavelength and diameter. The distinct streaks of high intensity indicate the presence of the various leaky mode resonances, with the first three indexed. The arrows mark the one-to-one correlation between the single-wire leaky mode resonances and the photocurrent enhancement peaks.

The figure also shows the predicted absorption spectra (dotted line) for cylindrical NWs based on the well-established Lorentz-Mie light scattering formalism. In order to compare the experimental and theoretical results, both datasets are given in terms of the spectral absorption efficiency, $Q_{abs}$, which is defined as the absorption cross-section normalized to the geometrical cross-section of the NW. Distinct peaks can be observed in the $Q_{abs}$ spectra that exhibit a substantial dependence on the NW size, consistent with the excitation of LMRs. The good agreement between the experimental and calculated spectra suggests that the LMR-enhanced absorption in the NWs can be approximated by the Lorentz-Mie formalism and by assuming a homogeneous host medium of unity refractive index. The good agreement is not unexpected as the relevant modes are well-confined to the high-index NW and the interaction with the substrate is minimal. Although even better agreement can be obtained using more time-consuming full-field simulations that include the presence of a substrate, the analytic Lorentz-Mie theory allows for a rapid first-order optimization of the NW-based PV cells as discussed below.

In order to optimize PV performance with LMRs, we first aim to identify the optimum SiNW diameter, d, that will maximize the absorption of sunlight and thus short circuit current density, $J_{SC}(d)$. To this end, we calculate $Q_{abs}(\lambda, d)$ for SiNWs of different diameters and integrate the calculated absorption with the spectral photon flux density delivered by the sun, $F_s(\lambda)$. This integral gives the short-circuit photocurrent density of a single NW solar cell, $J_{SC}(d) = q \int F_s(\lambda) Q_{abs}(\lambda, d) d\lambda$. Here, q is the charge carried by one electron. In the calculation we assumed an internal quantum efficiency of 100%, which has recently been demonstrated with NW junction devices. The current density refers to the photocurrent divided by the geometrical cross-sectional area of the NW (d·l, where l is the length of the NW). In order to make a comparison to planar Si structures, we have also calculated the absorption of light in a surface layer of a crystalline Si wafer with the same thickness as the wire. For these calculations, we have used the well-established optical properties of single-crystalline silicon. As shown in the upper panel of FIG. 4b, the NW produces a much larger photocurrent density than that of bulk Si for the same volume of material. For example, an 80-nm-diameter NW experiences a 300% enhancement in the photocurrent per unit volume.

The role of the LMRs in the enhancement can clearly be seen in a two-dimensional plot of the absorption efficiency $Q_{abs}$ versus $\lambda$ and d (FIG. 4b lower panel). This figure shows the absorption enhancements related to the various transverse electric ($TE_{ml}$) and transverse magnetic ($TM_{ml}$) LMRs of a NW illuminated under normal incidence, where m and l are the azimuthal mode number and radial order of the resonances respectively. A comparison between the upper and lower panels of FIG. 4b reveals a one-to-one correspondence between the peaks in the photocurrent enhancement and the spectral locations of the LMRs. As illustrated by the arrows in FIG. 4b, the first enhancement peak (the enhancement peaks are counted as first, second, third, etc. in the order of ascending diameter) finds its origin in the excitation of the lowest order LMR, which is $TM_{01}$. This peak is seen in NWs that are very small (~10 nm) compared to the wavelengths from the incident sun light; it arises from an electrostatic dipole excitation of the wire. The second and the third photocurrent peaks can be correlated to the following higher order LMRs, $TM_{11}/TE_{01}$ and $TM_{21}/TE_{11}$, respectively. From this analysis, the role of the various LMRs in enhancing the photocurrent and thus the PV performance is evident.

Figure 5A:
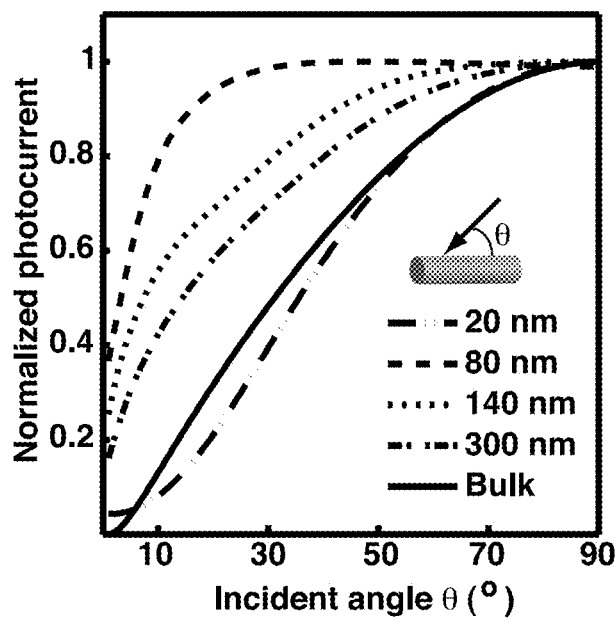
FIG. 5a is a plot of normalized photocurrent vs. incident angle for several different nano-wire diameters.
Figure 5B:
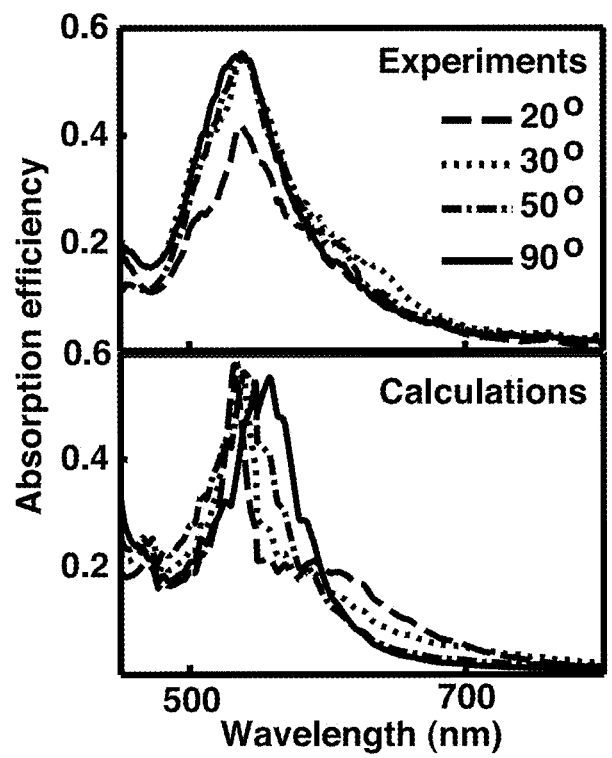
FIG. 5b is a plot of measured and calculated absorption efficiency for several different incident angles.

The LMRs not only enhance the NW's ability to absorb sunlight, they also can substantially minimize the dependence of the light absorption on illumination angle. Due to the cylindrical symmetry, a change in the illumination angle in the plane normal to the wire does not affect the light absorption. FIG. 5a shows dependence of the normalized $J_{sc}$ on the illumination angle for various diameter (20 nm, 80 nm, 140 nm, and 300 nm) silicon nanowires. The angle-dependence of the photocurrent in planar bulk silicon is also given for comparison. FIG. 5b shows measured (upper) and calculated (lower) absorption spectra of 100-nm-diameter silicon nanowires illuminated at different incidence angles (20°, 30°, 50°, and 90°). We can see that the photocurrent in the NW generally shows less dependence on the incident angle than that of a planar structure except for very small (~20 nm) wires. For the coming discussion, it is worth noting that NWs with diameters of ~80-100 nm exhibit a particularly small dependence of $J_{sc}$ on incident angle; their photocurrent is more-or-less constant until the incident angle is less than 20°.

The angle-dependence of the NW photocurrent can be understood from the angle-dependence in the excitation of LMRs. This angle-dependence has relatively simple geometric contributions and more complex materials contributions, which result from dispersion. In order to selectively explore the effects of geometry, the absorption efficiency $Q_{abs}$ was calculated as a function of a dimensionless size parameter nkd/2 (k, wavevector of the incident light in free space) and the illumination angle for a frequency-independent refractive index, n=4+0.03 i. This index value is representative of a high-index, absorbing semiconductor NW. Among all the LMRs for this example, it was found that the second order LMRs (i.e., $TE_{11}$ and $TM_{21}$) exhibit the weakest angle dependence and that the angle dependence is quite small for higher LMRs as well. Based on these results, it is natural to expect a substantial absorption enhancement and a weak angle-dependence in the response of SiNW solar cells when the second order LMRs provide a large contribution to the absorption of sunlight. FIG. 4b shows that c-SiNW sizes in the range from 80-100 nm provide a good wavelength match between the second order LMRs resonance and the peak of the solar spectrum (near 500 nm). More generally, the peak of the solar spectrum can be regarded as falling in a range from about 475 nm to about 525 nm, and it is preferred for the single-wire LMRs to have an absorption peak in this range for solar cell applications. The anticipated weak angle-dependence of the absorption in such SiNWs is confirmed by experimental and calculated absorption spectra on a 100-nm-diameter c-SiNW, as shown in FIG. 5b.

Figure 6A:
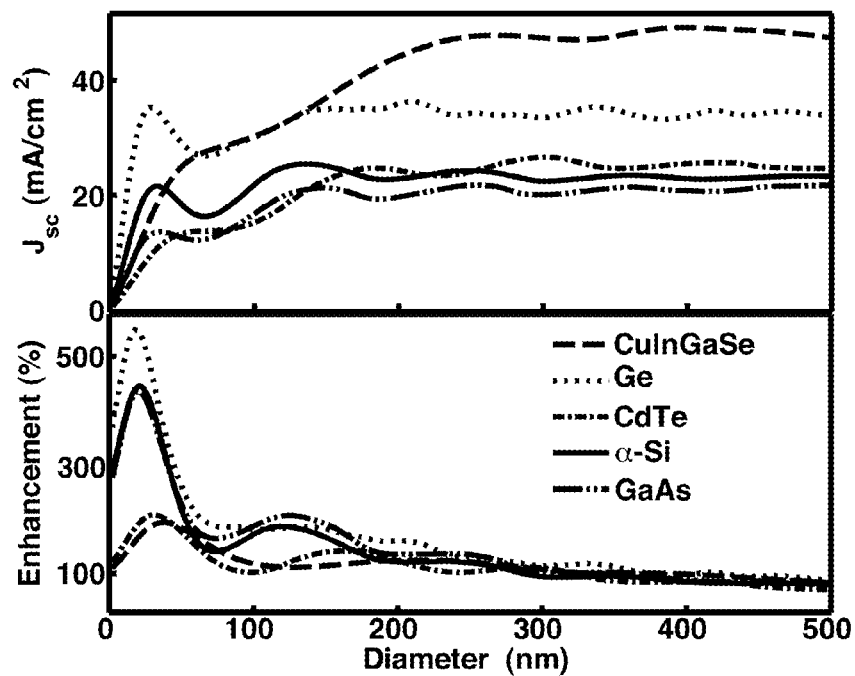
FIG. 6a is a plot of calculated photocurrent and photocurrent enhancement as a function of nano-wire diameter for several different nano-wire materials.
Figure 6B:
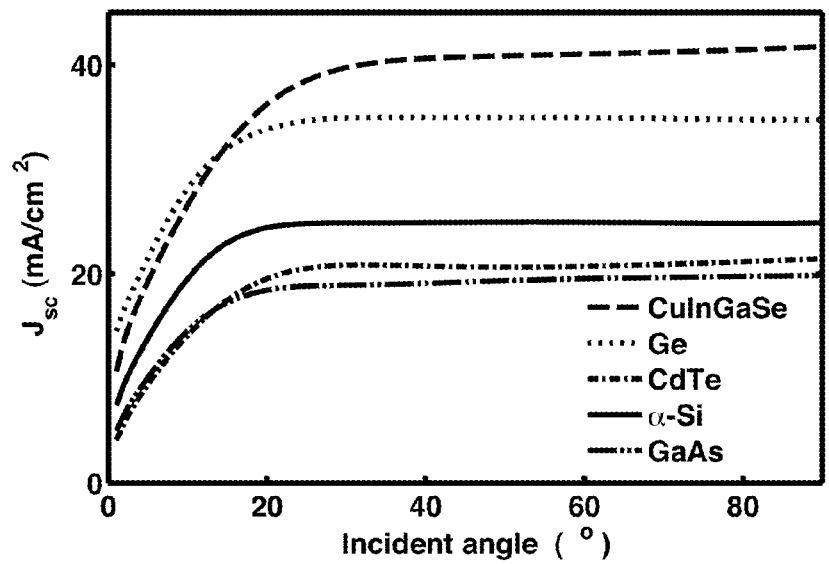
FIG. 6b is a plot of calculated photocurrent and photocurrent enhancement as a function of incident angle for several different nano-wire materials.

LMRs are essentially morphology-dependent resonances, arising from the finite NW size and the large refractive index contrast of the NW with respect to its surroundings. It should thus be expected that any high-index semiconductor used in solar applications could benefit from these types of resonances. FIG. 6a (upper) is a plot of short circuit photocurrent density $J_{sc}$ in nanowires of several major photovoltaic materials, including CuInGaSe, Ge, CdTe, amorphous Si, and GaAs, and (lower) is a plot of photocurrent enhancement in the nanowires compared to their bulk counterparts. FIG. 6b is a plot of minimized dependence of Jsc of various semiconductor nanowires on the incident angle. The diameters of the nanowires are CuInGaSe, 180 nm, Ge, 140 nm, α-Si, 120 nm, CdTe, 140 nm, and GaAs, 120 nm, respectively. Those diameters match the excitation of the second order LMRs. All materials systems that have been modeled or measured show significant enhancements and similar trends in the dependence on the nanowire size. Preferably, the diameter of the nano-wires is in a range from 120 nm to 200 nm. For all of the semiconductors, $J_{sc}$ tends to show good enhancements and little angle-dependence when the NW size is optimized to again match the second peak in the plots of photocurrent vs. size (FIG. 6b). For example, a 130-nm-diameter α-Si NW may generate $J_{sc}$ of ~24 mA/cm$^2$ out of ~49 mA/cm$^2$ that is available from the AM 1.5 spectrum. For NWs larger than 100 nm, $J_{sc}$ is approximately independent of size; these larger wires experience only minor gains in absorption at long wavelengths where the solar irradiance is relatively small.

Figure 7A:
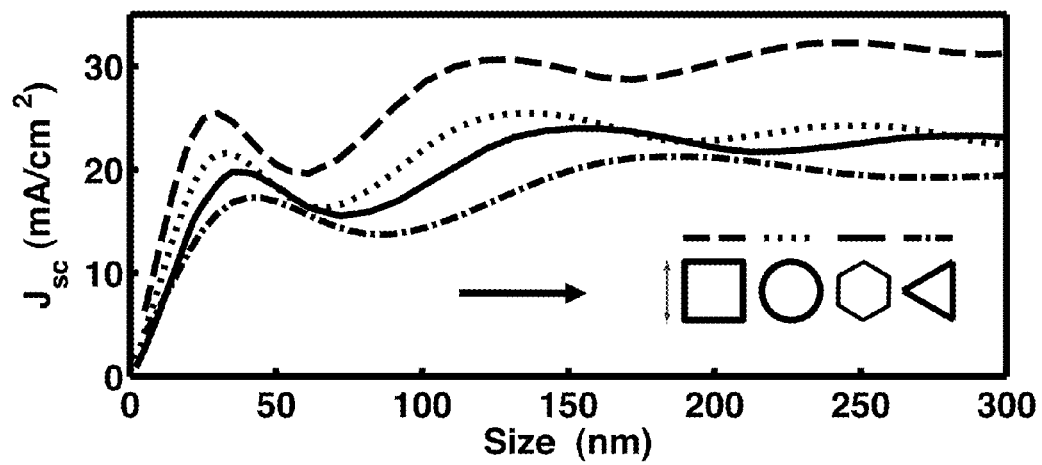
FIG. 7a is a plot of calculated photocurrent as a function of nano-wire diameter for several different nano-wire shapes.
Figure 7B:
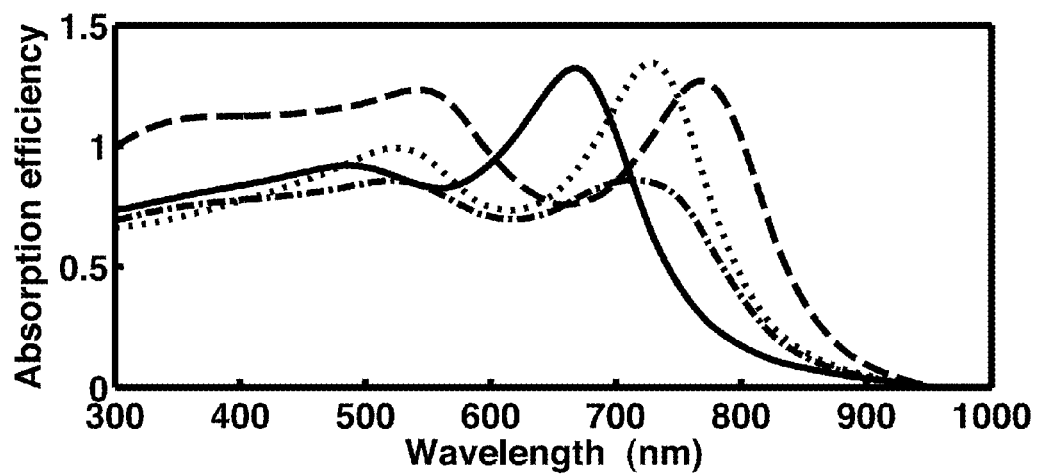
FIG. 7b is a plot of calculated absorption efficiency as a function of wavelength for several different nano-wire shapes.

Optical antenna resonances are not limited to a perfect cylindrical geometry and are a general feature of high-index nanostructures. FIG. 7a is a plot of calculated short-circuit photocurrent density $J_{sc}$ for 1-dimensional amorphous Si structures of circular, rectangular, hexagonal and triangular cross-section as a function of size. The inset schematic illustrates the way to compare the size for different structures with a double-headed arrow, and the thick solid arrow indicates the illumination geometry used in the calculations. Nano-wires having any cross section shape can be used to practice the invention. Suitable cross section shapes include, but are not limited to: circles, squares, rectangles, ellipses, triangles, and hexagons. FIG. 7b is a plot of calculated absorption spectra of these 1-dimensional structures in a size lying in the regime that corresponds to their second enhancement peaks shown in a. Specifically, the size is 180 nm for triangular cylinder and 130 nm for all other structures. The results for a cylinder are also given for reference. The spectra are qualitatively very similar. They all feature large absorption efficiencies (close to unity) over a wide frequency range. The observed differences in $Q_{abs}$ are primarily due to the different volumes of material in the structures. These results indicate that similar types of optical antenna resonances are excited in all the structures.

The above-described principles can guide the rational design of high-efficiency NW-based PV cells. This is illustrated with a PV cell design employing an array of α-Si NWs on a glass substrate, as shown in the inset of FIG. 8a. From the discussion on FIGS. 6a-b, we learnt that a 130 nm α-Si NW shows both a high short circuit current and a broad angular response. We take this NW as a building block for a NW-array cell. If its antenna properties can be preserved in the array configuration, the cell should generate a substantially higher $J_{sc}$ than an unstructured film of the same thickness, despite the lower volume of semiconductor. In order to keep the discussion as general as possible, we calculate the cell performance without making assumption about the electrical design for the charge collection (e.g. pn-junction) nor do we make detailed assumptions about the electrical materials quality; we again simply assume a 100% internal quantum efficiency for the NWs and have the enhancements in $J_{sc}$ directly reflect enhancements in the absorption of sunlight. This computation therefore provides an intrinsic measure of the efficiency gain in the use of NWs as compared to thin films. To visualize the transition from a continuous film to an array of well-separated NWs, we calculated the $J_{sc}$ for a top-illuminated array of 130 nm rectangular NWs as a function of their spacing and compared it to the $J_{sc}$ of a 130 nm thick film, which is 11.3 mA/cm$^2$ (FIG. 8a). More specifically, FIG. 8a shows calculated photocurrent density $J_{sc}$ of an array of 130-nm-wide square nanowires as a function of the nanowire separation. The left-side vertical axis indicates the photocurrent normalized to that of a continuous film (zero separation). The optimum NW cell with a spacing of 130 nm features a ~25% increase in $J_{sc}$, while using only 50% of the material (250% increase in current per unit volume material). Preferably, the spacing of the nano-wires in the array is in a range from 120 nm to 200 nm.

Our data indicates that the optical resonances seen in the individual NWs play an important role in enhancing the absorption of sunlight by the array. Their importance is first of all reflected in the weaker dependence of $J_{sc}$ on the illumination angle for the NW array as compared to a film (unpatterned) materials This behavior is seen on FIG. 8b, which shows calculated dependence of the photocurrent density $J_{sc}$ on the illumination angle for the array with various spacing (50 nm, 130 nm and 260 nm) and a 130 nm thick film. The incident angle is changed in the plane where the wire axis lies in, as shown. This figure shows that for increasing NW spacings the angular response broadens, retrieving the very broad angular response of individual NWs for sufficiently large spacings. The broadband nature of the absorption spectra as well as the large magnitude of $Q_{abs}$ and the electric field distribution inside each NW in an optimized (130 nm spacing) array also reflect/resemble those of individual NWs. This behavior is seen on FIG. 8c, which shows calculated absorption spectra of a 130-nm-wide square nanowire in the array with different separations of 30 nm, and 130 nm. The dash-dotted line is the absorption spectra of a single nanowire on the same substrate. The broad absorption spectrum of the array with the 130 nm spacing strongly resembles that of a single nanowire.

From the above discussion, it is apparent that the intrinsic and strong optical antenna effects in semiconductor NWs offer a very general and highly effective PM strategy for solar cells. This approach may form the basis for a valuable new PV platform technology that is applicable to all semiconductor materials and a wide variety of one-dimensional nanostructures. In addition to the straight, periodic NW arrays discussed here, complex interconnected semiconductor patterns or aperiodic arrays are expected to exhibit similar resonances, opening up a large parameter space for study and optimization. To further boost the performance of these devices, one may also add more conventional PM techniques such as AR-coatings and backreflectors. The required structures are quite large (>100 nm) and can be fabricated using standard, scalable thin film deposition and patterning technologies. Straight NW antennas can also be mass-produced and deposited using low-cost procedures such as roll-to-roll ink jet printing on inexpensive plastic substrates. In addition to the possibilities for solar energy applications, this approach is quite general and could also be applied to ultra-fast photodetectors, imagers, sensors, and in reverse for solid state-lighting.

Figure 9A:
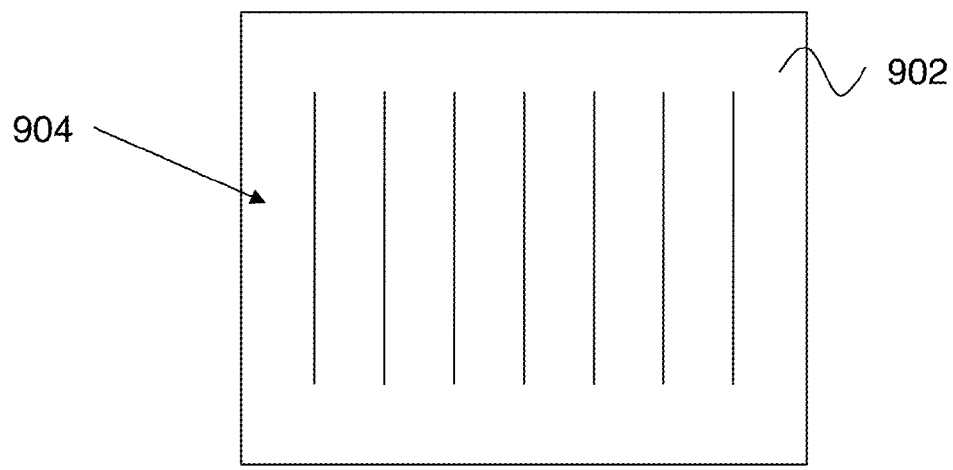
FIGS. 9a-b show further exemplary embodiments of the invention.
Figure 9B:
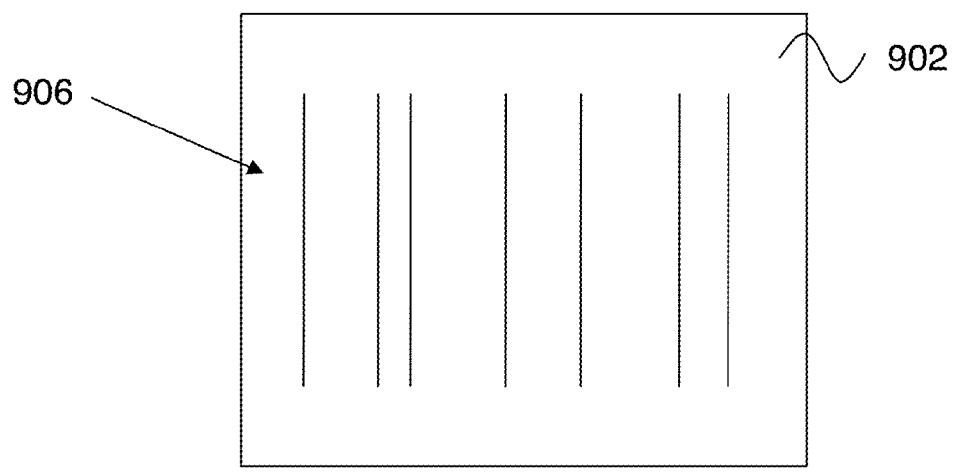

The preceding description has been by way of example as opposed to limitation, and many variations of the given examples also constitute practice of the invention. For example, the nano-wire arrays can be periodic, as in the preceding examples, or aperiodic. FIG. 9a shows a periodic nano-wire array 904 on a substrate 902. FIG. 9b shows an aperiodic nano-wire array 906 on substrate 902.

The examples given above relate to single-wire leaky mode resonances. However, the present principles are also applicable to other cases where an array resonance arises from a leaky mode resonance of one or more nano-wires (e.g., from pairs of coupled nano-wires).

The preceding description has mainly concentrated on the solar cell application. However, the present approach for providing increased efficiency of optical absorption is broadly applicable. Applications include, but are not limited to: solar energy, photodetection, photocatalysis, and imaging. In each case, incident radiation having a spectral intensity peak can be more efficiently detected/collected by spectrally aligning the incident spectral intensity peak with an array resonance of optical absorption of a nano-wire array.

The invention claimed is:

1. A method for absorbing electromagnetic radiation having an incident radiation spectrum with a spectral intensity peak, the method comprising:
providing an array of two or more semiconductor nano-wires disposed laterally on a substrate;
wherein the array has one or more array resonances of optical absorption;
wherein each of the array resonances arises from a corresponding leaky mode resonance of one or more of the nano-wires;
wherein each of the leaky mode resonances has a corresponding spectral absorption peak;
wherein one or more dimensions of the nano-wires are selected such that one of the spectral absorption peaks is substantially spectrally aligned with the spectral intensity peak.

2. A method for solar energy collection comprising the method of claim 1.

3. A method for photodetection comprising the method of claim 1.

4. A method for photocatalysis comprising the method of claim 1.

5. A method for imaging comprising the method of claim 1.

* * * * *